(12) United States Patent
Smith (10) Patent No.: US 8,172,147 B2
(45) Date of Patent: May 8, 2012

(54) METHOD AND SYSTEM FOR THE ESTIMATING THE ENERGY CONSUMPTION OF COMMERCIALLY AVAILABLE ELECTRICAL DEVICES

(76) Inventor: Christian Smith, San Jose, CA (US)

( * ) Notice: Subject to any disclaimer, the term of this patent is extended or adjusted under 35 U.S.C. 154(b) by 0 days.

(21) Appl. No.: 13/024,784

(22) Filed: Feb. 10, 2011

(65) Prior Publication Data

US 2011/0166839 A1      Jul. 7, 2011

(51) Int. Cl.
| | |
|---|---|
| G06K 7/14 | (2006.01) |
| G06K 7/10 | (2006.01) |
| G06K 15/00 | (2006.01) |
| G06K 5/04 | (2006.01) |
| G06F 7/00 | (2006.01) |
| G06Q 20/00 | (2012.01) |
| G01R 21/133 | (2006.01) |
| G01R 21/00 | (2006.01) |

(52) U.S. Cl. ........ 235/487; 235/454; 235/376; 235/378; 235/377; 235/462.01; 235/462.41; 235/462.24; 235/462.11; 705/63; 705/412; 702/60; 702/62

(58) Field of Classification Search ............. 235/462.01, 235/435, 454, 487, 472.01, 376, 462.41, 235/462.24, 462.11, 378; 703/3, 13; 705/63, 705/412; 702/60–62

See application file for complete search history.

(56) References Cited

U.S. PATENT DOCUMENTS

| | | | | |
|---|---|---|---|---|
| 4,120,031 | A * | 10/1978 | Kincheloe et al. ............. | 705/412 |
| 4,334,275 | A * | 6/1982 | Levine ............................ | 702/61 |
| 4,401,943 | A * | 8/1983 | Morris .......................... | 324/157 |
| 5,870,140 | A * | 2/1999 | Gillberry ...................... | 348/160 |
| 7,643,951 | B2 * | 1/2010 | Stewart .......................... | 702/63 |
| 7,844,433 | B2 * | 11/2010 | Masuda et al. ................. | 703/13 |
| 7,853,391 | B2 * | 12/2010 | Komeda et al. ................ | 701/99 |
| 8,032,317 | B2 * | 10/2011 | Houston et al. ................ | 702/62 |
| 2001/0005830 | A1 * | 6/2001 | Kuroyanagi ....................... | 705/2 |
| 2002/0009144 | A1 * | 1/2002 | Ishihara et al. .......... | 375/240.16 |
| 2002/0144162 | A1 * | 10/2002 | Tada et al. ..................... | 713/300 |
| 2003/0088374 | A1 * | 5/2003 | Slater et al. ..................... | 702/61 |
| 2003/0115000 | A1 * | 6/2003 | Bodas ............................. | 702/60 |
| 2003/0158677 | A1 * | 8/2003 | Swarztrauber et al. ......... | 702/62 |
| 2003/0171851 | A1 * | 9/2003 | Brickfield et al. ............ | 700/286 |
| 2008/0319601 | A1 * | 12/2008 | Komeda et al. ................ | 701/29 |
| 2009/0055300 | A1 * | 2/2009 | McDowell ...................... | 705/34 |
| 2009/0099801 | A9 * | 4/2009 | Swarztrauber et al. ......... | 702/64 |
| 2009/0235106 | A1 * | 9/2009 | Easton et al. ................. | 713/340 |
| 2009/0287433 | A1 * | 11/2009 | Houston et al. ................ | 702/62 |
| 2010/0070217 | A1 * | 3/2010 | Shimada et al. ............... | 702/62 |
| 2010/0082499 | A1 * | 4/2010 | Luff ............................. | 705/317 |
| 2010/0089909 | A1 * | 4/2010 | Besore et al. ................. | 219/720 |
| 2010/0167659 | A1 * | 7/2010 | Wagner ....................... | 455/67.11 |
| 2010/0214578 | A1 * | 8/2010 | Lewnard et al. ............... | 358/1.9 |
| 2010/0326471 | A1 * | 12/2010 | Dalsing et al. .................. | 134/18 |
| 2011/0040990 | A1 * | 2/2011 | Chan et al. .................... | 713/300 |
| 2011/0313695 | A1 * | 12/2011 | Houston et al. ................ | 702/62 |

* cited by examiner

*Primary Examiner* — Daniel Walsh (57) ABSTRACT

Some embodiments of the present invention provide a system for estimating electrical power usage of commercially available devices utilizing a portable computing device equipped with a digital camera. In some embodiments, initial input to the system is accomplished by taking a digital photograph of an electrical device surface in order to capture text or other marks such as barcodes from which power usage of the device can be determined. In some embodiments OCR (optical character recognition) is used to retrieve text from the digital photograph. If successfully extracted from the captured text, power parameters such as voltage, amperes and watts are provided to the system user on the display of the mobile device. At this point an estimate of electrical device usage during a particular time period, such as a week, can be input into the system. The system will then calculate power usage over the specified time period for the electrical device and show the result on the system display.

20 Claims, 6 Drawing Sheets

METHOD AND SYSTEM FOR THE ESTIMATING THE ENERGY CONSUMPTION OF COMMERCIALLY AVAILABLE ELECTRICAL DEVICES

BACKGROUND OF THE INVENTION

Electricity is frequently the major component of residential, commercial and industrial utility bills. In spite of this fact many, if not most, home and business owners are unaware of how much electricity individual electrical devices actually consume. Currently, utility bills sent to consumers provide only monthly electrical usage in KWH (kilowatt hours) for a customer location. With the advent of "smart meters" more detail may become available to consumers, such as electricity consumed during particular hours of the day. Nonetheless, information contained in utility bills will not enable the consumer to calculate the energy usage of individual electrical devices. In most cases the only means currently available to derive this information is to physically examine each device for the presence of power usage information (e.g. voltage, amps or watts) on the exterior of the device. Such information though generally present, may be difficult to interpret for various reasons. One reason is that depending on the age of the device, power information may appear in various formats or be incomplete. Another reason is that the power information may appear in a small font surrounded by a large body of unrelated text making it difficult to decipher. Yet another reason is that the power usage information may appear in a location on the device that is difficult to access or where lighting is poor, such as the back of a washing machine. These are just a few examples of problems consumers may face. Estimating the power usage of a particular electrical device is a difficult task even for those consumers knowledgeable in the basics of electricity and willing to make the effort to read the labels attached to their electrical appliances.

BRIEF SUMMARY OF THE INVENTION

Some embodiments of the present invention provide a system for estimating electrical power usage of commercially available devices utilizing a portable computing device equipped with a digital camera. In some embodiments, initial input to the system is accomplished by taking a digital photograph of an electrical device surface. The goal is to capture text or other marks such as barcodes, provided by the device manufacturer, from which power usage of the device can be determined. Next, OCR (optical character recognition) may be used to retrieve text from the digital photograph. If the power usage of the device can be determined from the captured text, power parameters such as voltage, amperes and watts are provided to the system user on the display of the mobile device. In the event that text capture is unsuccessful, power parameters can be entered into the system by means of an input device such as a keyboard or touchscreen. At this point an estimate of electrical device usage during a particular time period, such as a week, can be input into the system. The system will then calculate power usage over a specific time period (e.g., one month) for the electrical device and show the result on the system display.

The above method can be repeated for various electrical devices sharing one or more electrical circuits allowing the system user to estimate total electrical usage over the circuit or group of circuits for a given time period. The method can be employed in other contexts as well. For example, a consumer may wish to compare power usage over time of electrical appliances in a retail setting prior to making a purchase.

Use of the present invention in residential, commercial, or retail settings can clearly result in more efficient utilization of electrical devices, thereby conserving precious energy resources.

DETAILED DESCRIPTION OF THE INVENTION

The following description is presented to enable any person skilled in the art to make and use the disclosed embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present description. Thus, the present description is not intended to be limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. This includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

For purposes of this disclosure, a "power parameter" is defined as any marking appearing on an electrical device, placed there by the manufacturer or a manufacturer authorized third party which may be directly or indirectly useful in the determination of the electrical device's electrical power usage.

Examples of power parameters used in one or more embodiments of the invention are voltage required by the device (volts), current drawn by the device expressed in amperes (amps) and power used by the device expressed in watts. Power parameters may further include, but are not limited to, the name of the manufacturer, the manufacturer designated model number, the manufacturer designated model name, codes provided by third parties such as UL (Underwriters Laboratories), barcodes provided by the manufacturer or authorized third parties, and logos or trademarks placed on the electrical device by the manufacturer or manufacturer authorized third parties.

For purposes of this disclosure "power parameter processing" is defined as extraction by a computer software program of power parameters from a digital image.

For purposes of this disclosure, a "time parameter" is defined as any data related to the frequency and/or duration of use of an electrical device which may be useful in the determination of the electrical device's electrical power usage over a specific time period.

In general, embodiments of the invention provide a method and system for estimating the electrical power usage of an electrical device. More specifically, some embodiments of the invention provide a method and system for performing estimates of electrical device power usage by means of a portable device, such as portable phone. In one or more embodiments of the invention, hardware and software components native to the portable device are used to gather and process power parameters and time parameters, thereby deriving an estimate of the electrical power usage of an electrical device for a specific time period. In some embodiments of the invention, the portable device may also rely on one or more software applications residing on a remoter server to supplement processing on the portable device. As a result, with some embodiments, the portable device may be used by an individual in the field to estimate overall power consumed by electrical devices sharing one or more electrical circuits. Just as easily, an individual may employ some embodiments in a retail environment, as a basis for identifying the most energy efficient and cost effective electrical products to purchase for home or commercial use. Many other uses of various embodiments of the invention are possible and all will become increasingly important as worldwide energy resources become depleted and the cost of electrical energy to the consumer increases.

Figure 1:
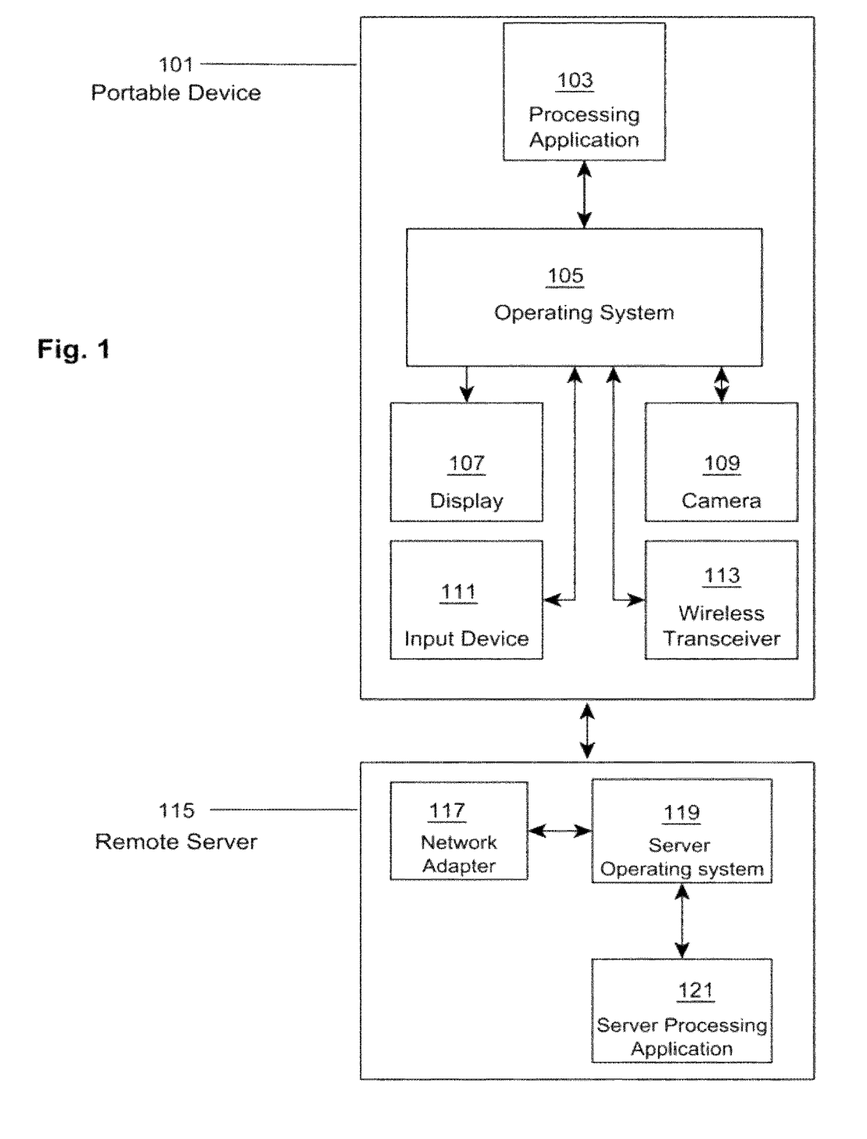
FIG. 1 shows a schematic of a portable device in accordance with an embodiment of the present invention.

FIG. 1 shows a schematic in accordance with one possible embodiment of the present invention. The system includes portable device 101 comprising processing application 103, operating system 105, camera 109, display 107, input device 111 and wireless transceiver 113. Also depicted in FIG. 1 is a possible embodiment of remote server 115 comprised of server operating system 119, network adapter 117 and server processing application 121. Portable device 101 and remote server 115 are described in further detail below.

Portable device 101 may correspond to a portable electronic device that provides one or more services or functions to a user. For example, portable device 101 may operate as a portable phone, portable computer, global positioning system (GPS receiver, portable media player, and/or graphing calculator). In addition, portable device 101 may include an operating system 105 that coordinates the use of hardware and software resources on portable device 101, as well as one or more applications (e.g., processing application 103) that perform specialized tasks for the user. For example, portable device 101 may include applications such as an email client, an address book, a document editor, a media player as well as various custom applications. To perform tasks for the user, applications may obtain access to hardware resources (e.g., processor, memory, I/O components, etc.) on portable device 101 from operating system 105. Applications may also interact with the user through a hardware and/or software framework provided by operating system 105, as described below.

To enable interaction with the user, portable device 101 may include one or more hardware input/output (I/O) components, such as display 107, camera 109, input device 111, and wireless transceiver 113. Each hardware I/O component may additionally be associated with a software driver (not shown) that allows operating system 105 and/or applications on portable device 101 to access and use the hardware I/O components.

Display 107 may be used to display images and/or text to one or more users of portable device 101. In one or more embodiments of the invention, display 107 serves as the primary hardware output component for portable device 101. For example, display 107 may allow the user(s) to view menus, icons, windows, emails, websites, videos, pictures, maps, documents, and/or other components of a graphical user interface (GUI) provided by operating system 105.

Those skilled in the art will appreciate that display 107 may incorporate various types of display technology to render and display images. For example, display 107 may be a liquid crystal display (LCD), an organic light-emitting diode (OLED) display, a surface-conducting electron-emitter display (SED), and/or other type of electronic display.

Input device 111 may functions as a hardware input component of portable device 101. Specifically, input device 111 may allow the user to point to and/or select one or more areas of display 107 using a cursor, highlight, and/or other visual indicator. Input provided by the user using input device 111 may be processed by the corresponding software driver and sent to operating system 105 and/or one or more applications (e.g., processing application 103) as one or more actions.

Input device 111 may receive user input through various methods, including touchscreens, touchpads, buttons, voice recognition, keypads, keyboards, and/or other input methods. In addition, multiple input devices may exist on portable device 101. Operating system 105 and/or applications on portable device 101 may use the input from the input device 111 to perform one or more tasks and update a system graphical user interface (not shown). Images may be sent by operating system 105 to a screen driver (not shown), which may display the images on display 107 as a series of pixels. As a result, the user may interact with portable device 101 by using input device 111 to provide input to operating system 105 and/or applications and receiving output from operating system 105 and/or applications through display 107. Some embodiments of the present invention allow the user of portable device 101 to enter one or more time parameters using input device 111. Some embodiments allow the user of portable device 101 to enter power parameters using input device 111.

Camera 109 may allow the user to capture images using portable device 101. For example, camera 109 may correspond to a portable phone camera or a webcam on a laptop computer. Camera 109 may also record still and/or video images using a lens and digital image sensor. The images recorded by camera 109 may additionally be stored in a file system (not shown) of portable device 101 and used by one or more applications (e.g., processing application 103). In one or more embodiments of the invention, one or more digital images are taken by camera 109 in order to capture power parameters. Digital images may be processed by processing application 103 to retrieve power parameters. In some embodiments processing application 103 may use optical character recognition (OCR) to retrieve power parameters from digital images taken by camera 109. In some embodiments processing application 103 may extract power parameters from a barcode captured in a digital image taken by camera 109.

In some embodiments of the present invention, digital images originating from a source other than digital camera 109 may be used as input to processing application 103. Such images may be placed in the file system of portable device 101 by another application present on portable device 101 such as an email application.

Wireless transceiver 113 may allow portable device 101 to connect to one or more wireless networks, such as wireless local area networks (LANs) and/or portable devices networks. Portable device 101 may also communicate with one or more locations on the network(s) by sending and/or receiving data over the network(s) using wireless transceiver 113. For example, portable device 101 may use wireless transceiver 113 to retrieve web pages, make calls, download and upload files, and send and receive emails over the network(s).

In some embodiments, portable device 101 may use wireless transceiver 113 to communicate with remote server 115. Remote server 115 may send and receive data over a network by means of network adapter 117. Server operating system 119 may coordinate data flow from network adapter 117 by means of a software device driver (not shown). Server operating system 119 may also read and write data to a file system (not shown) where it can be accessed by server processing application 121 and other applications present on remote server 115. Server operating system 119 can then provide network adapter 117 with data output by server processing application 121 to be sent to portable device 101. In some embodiments server processing application 121 may extract power parameters from a digital image sent from portable device 101. Power parameter extraction may be accomplished using OCR. In some embodiments server processing application 121 may retrieve power parameters from a digital image sent from portable device 101 by extracting them from a barcode. Those skilled in the art will recognize that it may be advantageous for portable device 101 to rely on remote server 115 for a wide range of processing tasks, particularly where hardware and/or software resources available on portable device 101 are inadequate for the particular task. In some embodiments one such processing task might be to use advanced OCR algorithms to extract power parameters from a digital image. Another such processing task may be the determination of particular power parameters, for example volts and amps, where the only power parameters available in a digital image are items such as manufacturer name and model number. Yet another task may be handling CPU (central processing unit) intensive activities, such as processing required where the digital image is a video.

In some embodiments of the invention, if processing application 103 is unable to successfully perform power parameter processing of an image, it may send the image to server processing application 121 as described above. Server processing application 121 may return power parameters to processing application 103 if power parameter processing was successful.

If power parameter processing was unsuccessful on remote server 115, server processing application 121 will return an error code.

Figure 2:
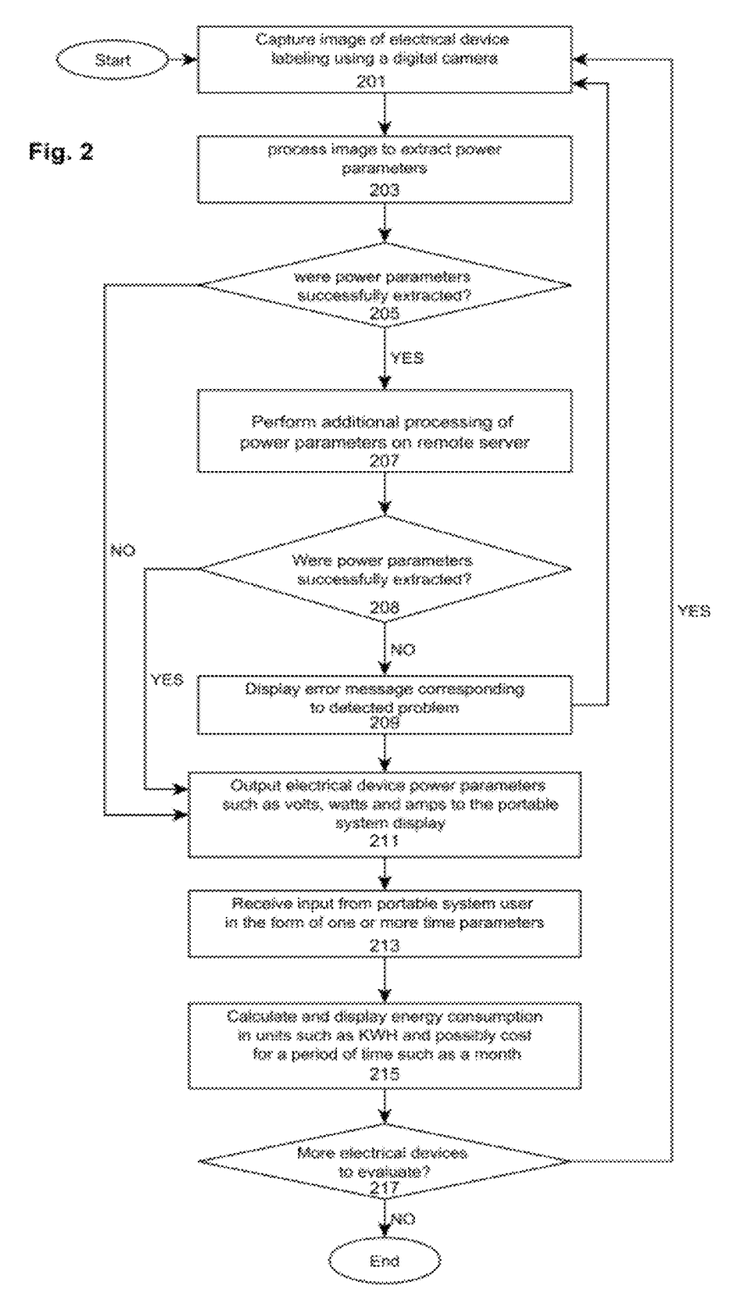
FIG. 2 shows a flowchart in accordance with an embodiment of the current invention.

FIG. 2 shows a flowchart of the steps involved in estimating the power usage of an electrical device in accordance with an embodiment of the present invention. In one or more embodiments of the invention, one or more of the steps may be omitted, repeated, and/or performed in a different order. Accordingly, the specific arrangement of steps shown in FIG. 2 should not be construed as limiting the scope of the invention. Initially a camera is used to obtain a digital image of the surface of an electrical device. The goal is to capture an image of manufacturer supplied labeling that contains information related to the power usage of the electrical device (operation 201). The camera may be a component of a portable device or detached from the portable device. Where a detached camera is used, the digital image must be transferred to a disk drive or other storage medium on the portable device. Next, a computer program on the portable device processes the digital image to extract power parameters (operation 203). The next step is a decision point (operation 205). If the computer program on the portable device was not able to extract power parameters from the image, the image is sent to a remote server for additional processing (operation 207). If power parameter processing is unsuccessful on the remote server, the portable device displays an error message (operation 209). One skilled in the art will recognize that many types of errors may occur when using a camera to obtain an image to be processed by OCR. For example, the camera may have been held too far away from the electrical device surface, the camera flash may be reflected in the image, only part of the label was captured in the image, etc. Errors such as these may cause OCR or other parameter extraction techniques to fail. After viewing the error message on the portable device, the portable device user may decide to start over and take another digital image of the electrical device surface to be processed (operation 201). Alternatively, the user may enter power parameters into the portable device manually, using an input device such as a keyboard or touchscreen. Once power parameter extraction is successful, or the user manually enters the power parameters into the portable device, power parameters such as volts, watts and amps are sent to the portable device display where they can be viewed by the portable device user (operation 211). At this point the portable device user manually enters one or more time parameters into the portable device (operation 213). An example of a time parameter might be the hours per week the electrical device is used. Next, the computer program will use power parameters and time parameters to derive an estimate of the power usage of the electrical device over a specific time period and output that information to the portable device display (operation 215). For example, the computer program may output power usage of an electrical device expressed in kilowatt-hours (KWH) per month. In some embodiments, the actual cost of the electricity consumed by the electrical device may also be displayed. At the final decision point (operation 217) the portable system user may decide to estimate usage of another electrical device (operation 201), or end the computer program.

Figure 3:
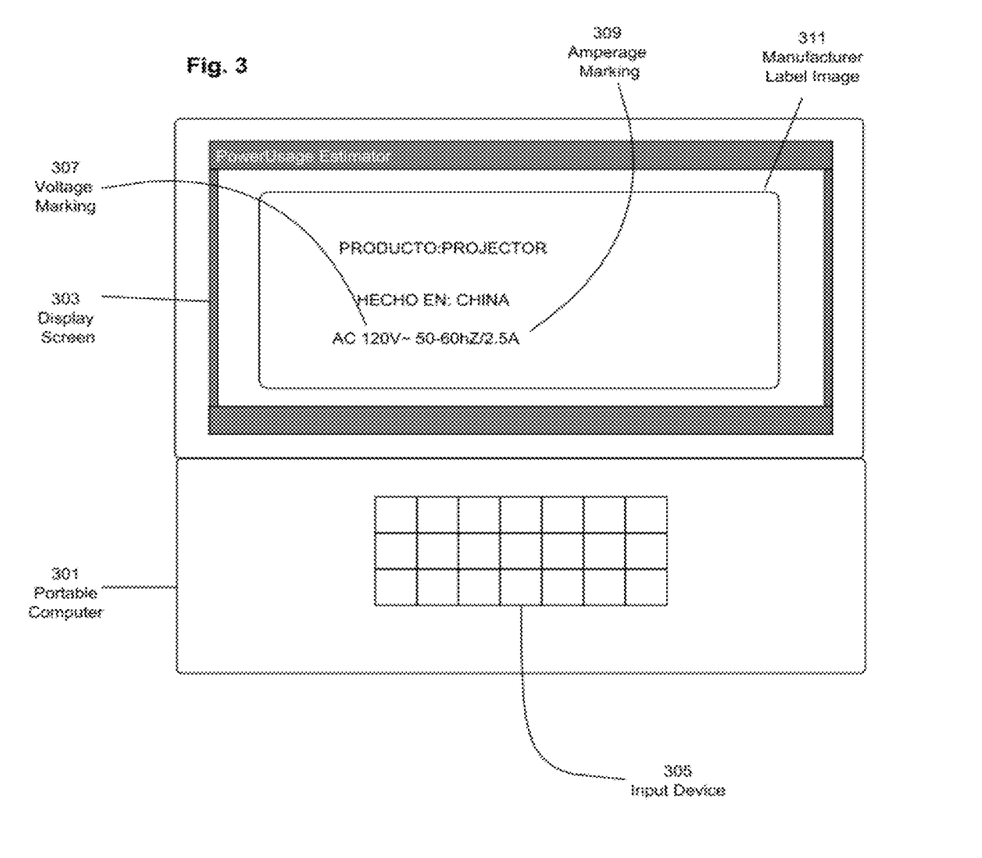
FIGS. 3-6 show exemplary screenshots in accordance with an embodiment of the invention.

FIG. 3 shows an exemplary screenshot of an embodiment of the current invention. Here the user has just obtained manufacturer label image 311 for processing. Manufacturer label image 311 is typical of an image that might be captured with a camera (not shown) from the surface of an electrical device in accordance with an embodiment of the present invention. The screenshot is shown on display screen 303 of portable computer 301. Input device 305 allows user input to portable computer 301. Voltage marking 307 points to an area within manufacturer label image 311 where the manufacturer has indicated the voltage (volts) required by the electrical device. Specifically, the manufacturer has used characters "120V" to designate a voltage requirement of 120 volts. Similarly, amperage marking 309 points to an area within manufacture label image 311 where the manufacturer has indicated the current drawn by the electrical device in amperes (amps). Specifically, the manufacture has used the characters "2.5 A" to indicate the electrical device will draw 2.5 amps of current. As described above, a computer program running on portable computer 301 has the ability to extract the text from manufacture label image 311 by means of OCR, and then analyze the extracted text to determine power parameters present in extracted text. In the case the power parameters are the volts and amps as specified by the manufacturer.

Figure 4:
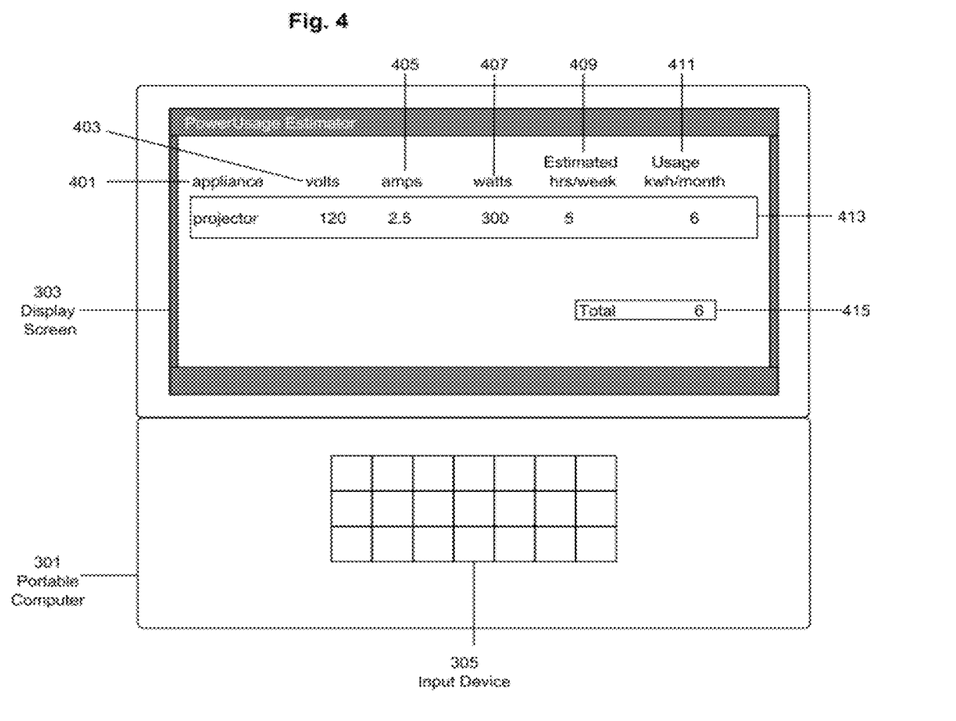

FIG. 4 shows another exemplary screenshot of an embodiment of the current invention following extraction of power parameters volts and amps from manufacturer label image 311. Here the portable computer 301 user enters an estimate of the hours per week an electrical device is used in column 409 and is shown the corresponding kilowatt hours of power per month used by the electrical device (as calculated by a software program running on portable computer 301) in column 411. Values in detail row 413 relate to the electrical device bearing the label captured in manufacturer label image 311. The following description relates specifically to detail row 413. Any manual data entry is accomplished by means of input device 305. Any values not manually entered are output to display screen 303 by a software program running on portable computer 301. In column 401 the user has manually entered "projector" as the appliance (electrical device) name. The values 120 in column 403 and 2.5 in column 405 correspond to the volts and amps power parameters, respectively, extracted from manufacture label image 311 as described above. The value for watts in column 407 is calculated using the volts and amps power parameter values extracted from label image 311. Column 409 contains a time parameter manually entered by the user, and is an estimate of the weekly hours the electrical device is in use. Column 411 provides the user with the estimate of power usage by the device for a specific period, in this case kilowatt hours per month. The estimate of column 411 is calculated based on the user provided time parameter appearing in column 408 and the previously calculated watts value shown in column 407. Moving away from detail row 413, also shown in the exemplary screenshot of FIG. 4 is summary row 415. The value in column 411 of summary row 415 is the sum of kilowatt hours usage per month in for all electrical devices processed (in this case only a single electrical device).

Figure 5:
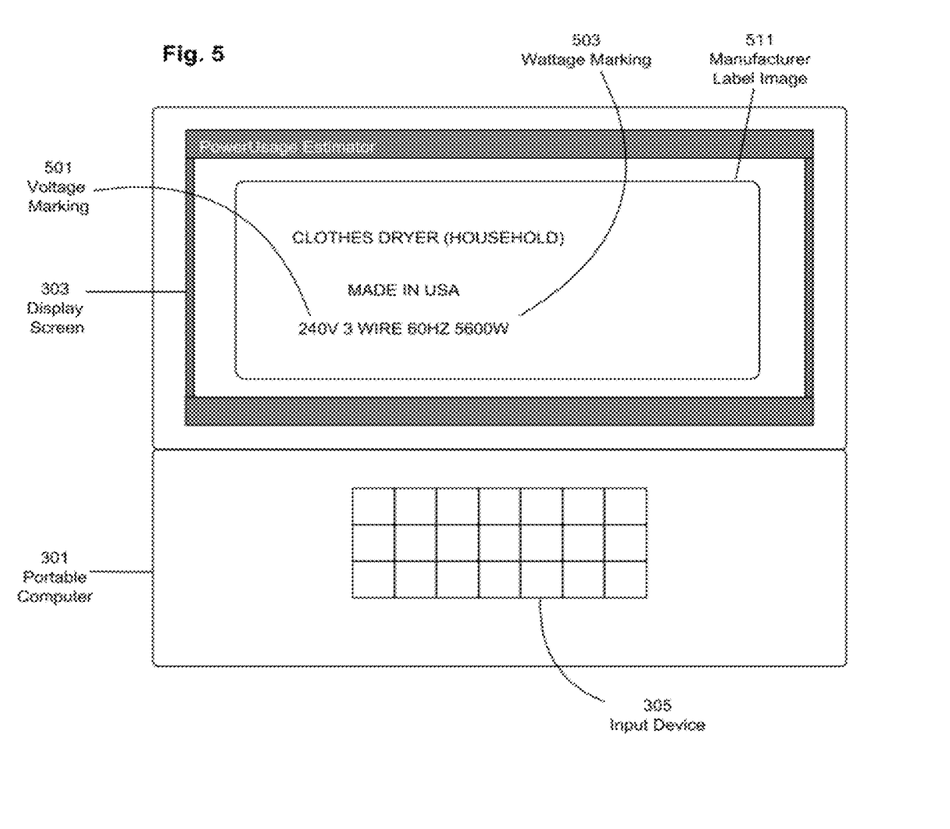

FIG. 5 shows another exemplary screenshot of an embodiment of the current invention. Here the user has just obtained a second image, manufacturer label image 511, for processing. Manufacturer label image 511 is typical of an image that might be captured with a camera (not shown) from the surface of an electrical device in accordance with an embodiment of the present invention. Voltage marking 501 points to an area within manufacturer label image 511 where the manufacturer has indicated the voltage (volts) required by the electrical device. Specifically, the manufacturer has used characters "240V" to designate a voltage requirement of 240 volts. Wattage marking 503 points to an area within manufacture label image 511 where the manufacturer has indicated the power used by the electrical device. Specifically, the manufacture has used the characters "5600 W" to indicate the electrical device uses 5600 watts of power.

Figure 6:
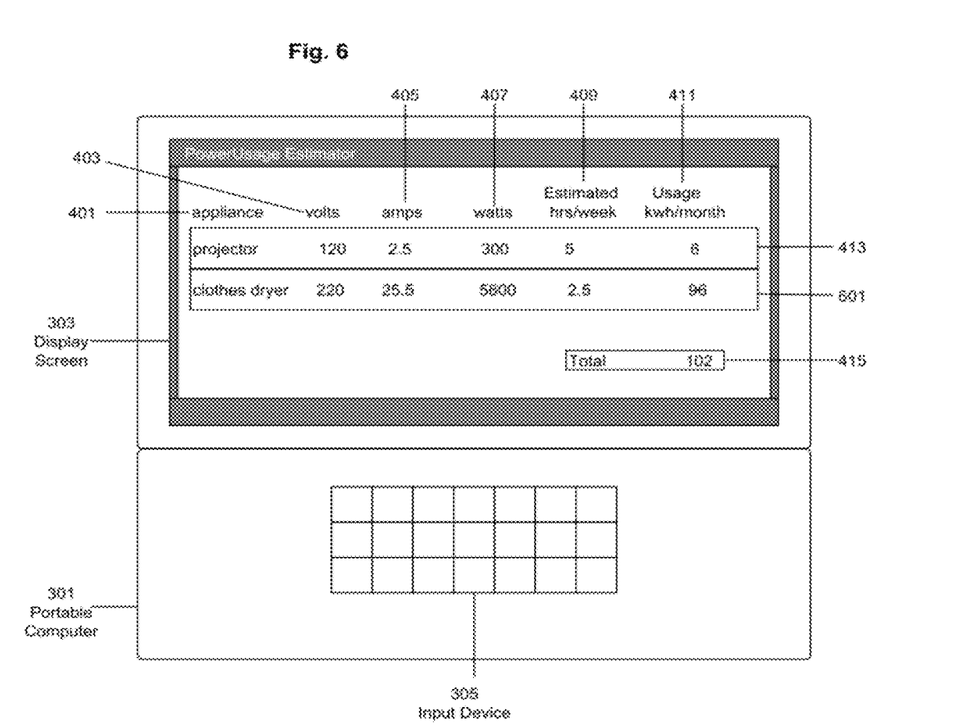

FIG. 6 shows yet another exemplary screenshot of an embodiment of the current invention following extraction of power parameters volts and watts from manufacturer label image 511. Values in detail row 601 relate to the electrical device (not shown) bearing the label captured in manufacturer label image 511. Here the user has manually entered "clothes dryer" in column 401 of detail row 601 to indicate the type of appliance (an electrical device) that manufacturer label image 511 was attached to. Volts and watts in column 405 and column 407 respectively of detail row 601, are the power parameters extracted from manufacturer label image 511. Column 405 of detail row 601 contains a value for wattage derived from the volts and amps power parameters extracted from manufacturer label image 511. Column 411 of detail row 601 shows a monthly power usage estimate of 96 kilowatt hours per month based on the watts of power used by the electrical device (column 407) and the user estimated hours per week the electrical device runs (column 409). Column 411 of summary row 415 now contains total power usage in kilowatts per month for the electrical devices evaluated in detail rows 413 and 601.

The foregoing descriptions of embodiments have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

I claim:

1. A method for estimating the energy usage of an electrical device using a portable device operated by user comprising:
    obtaining a digital image of manufacturer provided labeling from the electrical device, said labeling being related to energy use of the electrical device;
    inputting the digital image with the processing application running on the portable device;
    performing power parameter processing of the digital image;
    inputting one or more user inputted time parameters to the processing application running on the portable device;
    outputting from the processing application an estimate of the power usage of the electrical device over a specific time period, based on the user inputted time parameters.

2. The method of claim 1 further comprising:
    directing output from the processing application to a display on the portable device.

3. The method of claim 1 wherein power parameter processing is performed by the processing application on the portable device.

4. The method of claim 1 wherein the power parameter processing is performed by a server processing application running on a remote server.

5. The method of claim 1 where power parameter processing is performed partially by the processing application on the portable device and partially by a remote processing application running on a remote server.

6. The method of claim 1, further comprising:
    if power parameter processing is unsuccessful:
    allow the portable device user to input power parameters manually to the processing application.

7. The method of claim 1 where power parameter processing is accomplished using optical character recognition (OCR).

8. The method of claim 1 where power parameter processing is accomplished by extracting data from a barcode.

9. The method of claim 1 where the digital image is a video.

10. The method of claim 1 where the digital image is obtained with a camera that is a component of the portable device.

11. A system for estimating the energy use of an electrical device, comprising:
    a portable device operated by a user, comprising:
    a camera configured to capture a digital image of manufacturer labeling on the electrical device, said labeling related to energy use of the electrical device;
    a wireless transceiver configured to send the digital image over a network; and
    a processing application configured to:
    receive as an input the digital image; and
    perform power parameter processing on the image; and
    exchange information with a server processing application running on a remote server; and
    determine an estimate of power usage of the electrical device over a specific time period, based on inputted time parameters by the user; and
    output the estimate of power usage of the electrical device over a specific time period;
    an input device configured to receive the inputted time parameters; and
    a display configured to provide visual information to the portable device user said visual information comprising said estimate of power usage of the electrical device over a specific time period.

12. The system of claim 11 further comprised of a remote processing application running on a remote server.

13. The system of claim 11 where power parameter processing is accomplished using optical character recognition (OCR).

14. The system of claim 11 wherein power parameter processing is accomplished by extracting data from a barcode.

15. A non-transitory computer-readable storage medium storing instructions residing on a portable device operated by a user that when executed by a computer cause the computer to perform a method for estimating the electrical power usage of an electrical device, the method comprising:
   obtaining via the portable device a digital image of manufacturer provided labeling provided on an electrical device, said label being related to energy use of the electrical device;
   performing power parameter processing using the digital image;
   receiving one or more time parameters as inputted time parameters from the user of the portable device;
   outputting an estimate of the energy usage of an electrical device over a specific time period, based on the inputted time parameters.

16. The computer-readable storage medium residing on a portable device of claim 15, the method further comprising:
   if power parameter processing on the portable device is unsuccessful:
   sending the digital image to a server processing application running on a remote server for further power parameter processing; and
   receiving power parameters or an error code from the remote processing application.

17. The computer-readable storage medium residing on the portable device of claim 15, the method further comprising:
   if power parameter processing is unsuccessful:
   receive power parameters from the user of the portable device as input.

18. The computer-readable storage medium residing on the portable device of claim 15 wherein power parameter processing is accomplished by extracting data from a barcode.

19. The computer-readable storage medium residing on the portable device of claim 15 wherein power parameter processing is accomplished by optical character recognition (OCR).

20. The computer-readable storage medium residing on the portable device of claim 15 wherein the digital image is a video.

* * * * *